US010404363B2

(12) United States Patent
Gohel et al.

(10) Patent No.: US 10,404,363 B2
(45) Date of Patent: Sep. 3, 2019

(54) OPTICAL PIN ELECTRONICS

(71) Applicant: Teradyne, Inc., North Reading, MA (US)

(72) Inventors: Tushar K. Gohel, Winchester, MA (US); Pavel Gilenberg, Needham, MA (US)

(73) Assignee: Teradyne, Inc., North Reading, MA (US)

( * ) Notice: Subject to any disclaimer, the term of this patent is extended or adjusted under 35 U.S.C. 154(b) by 97 days.

(21) Appl. No.: 15/583,554

(22) Filed: May 1, 2017

(65) Prior Publication Data

US 2018/0316420 A1 Nov. 1, 2018

(51) Int. Cl.
*H04B 10/077* (2013.01)
*H04B 10/25* (2013.01)
*G01R 31/00* (2006.01)
*H04B 10/07* (2013.01)
*H04B 10/40* (2013.01)
(Continued)

(52) U.S. Cl.
CPC ......... *H04B 10/0775* (2013.01); *G01R 31/00* (2013.01); *H04B 10/07* (2013.01); *H04B 10/2503* (2013.01); *H04B 10/2504* (2013.01); *H04B 10/40* (2013.01); *H04B 10/50* (2013.01); *H04B 10/60* (2013.01)

(58) Field of Classification Search
None
See application file for complete search history.

(56) References Cited

U.S. PATENT DOCUMENTS

| 4,907,230 A | 3/1990 | Heller et al. |
| 6,563,352 B1 | 5/2003 | Gohel et al. |
| 6,894,505 B2 | 5/2005 | Gohel |

(Continued)

FOREIGN PATENT DOCUMENTS

| WO | WO-2006/066112 A2 | 6/2006 |
| WO | WO-2010/054669 A1 | 5/2010 |

OTHER PUBLICATIONS

International Search Report for PCT/US2018/025630, 5 pages (dated Jul. 6, 2018).

(Continued)

*Primary Examiner* — Darren E Wolf
(74) *Attorney, Agent, or Firm* — Choate, Hall & Stewart LLP

(57) ABSTRACT

Example pin electronics includes driver circuitry to output a first optical signal to a UUT. The first optical signal is based on a first signal representing first informational content and one or more second signal representing first parametric information. Receiver circuitry receives a second optical signal from the UUT. The second optical signal is related to a third signal representing second informational content and one or more fourth signal representing second parametric information. Comparison circuitry obtains parametric data representing at least one of the first parametric information or the second parametric information, and compares, based on the parametric data, the at least one of the first parametric information or the second parametric information to one or more thresholds. Control circuitry adjusts at least some of the first parametric information prior to output of the first optical signal, and one or more of the thresholds.

22 Claims, 3 Drawing Sheets

(51) Int. Cl.
*H04B 10/60* (2013.01)
*H04B 10/50* (2013.01)

(56) References Cited

U.S. PATENT DOCUMENTS

| | | |
|---|---|---|
| 7,317,801 B1 | 1/2008 | Amir |
| 7,395,479 B2 | 7/2008 | Gohel et al. |
| 7,420,375 B2 | 9/2008 | Gohel |
| 8,086,100 B2 | 12/2011 | Aronson et al. |
| 8,310,270 B2 | 11/2012 | Gohel et al. |
| 8,988,081 B2 | 3/2015 | Gohel et al. |
| 9,240,774 B2 | 1/2016 | Gohel |
| 9,298,866 B1 | 3/2016 | Elmufdi et al. |
| 2003/0099139 A1 | 5/2003 | Abrosimov et al. |
| 2003/0206127 A1 | 11/2003 | Roberts et al. |
| 2004/0056666 A1 | 3/2004 | Gohel |
| 2005/0073268 A1 | 4/2005 | Schrodinger et al. |
| 2005/0146320 A1 | 7/2005 | Gohel |
| 2005/0193275 A1 | 9/2005 | Gohel |
| 2006/0036907 A1* | 2/2006 | Inscoe ............. G06F 11/263 714/12 |
| 2006/0161827 A1 | 7/2006 | Gohel et al. |
| 2007/0101214 A1* | 5/2007 | Stauffer ........ G01R 31/2855 714/724 |
| 2007/0273439 A1 | 11/2007 | Lin et al. |
| 2008/0109504 A1 | 5/2008 | McDonald |
| 2008/0158026 A1 | 7/2008 | O'Brien |
| 2009/0091347 A1 | 4/2009 | Gohel et al. |
| 2011/0199096 A1 | 8/2011 | Kidambi |
| 2011/0279109 A1 | 11/2011 | Masuda |
| 2012/0106351 A1 | 5/2012 | Gohel et al. |
| 2013/0106399 A1 | 5/2013 | Gohel et al. |
| 2013/0124134 A1 | 5/2013 | Gohel |
| 2014/0092394 A1* | 4/2014 | Detofsky ........... H04B 10/0731 356/501 |
| 2016/0094187 A1 | 3/2016 | Staudinger et al. |
| 2018/0316421 A1 | 11/2018 | Gohel et al. |
| 2018/0316423 A1 | 11/2018 | Gohel et al. |
| 2018/0316424 A1 | 11/2018 | Gohel et al. |
| 2018/0316990 A1 | 11/2018 | Gohel et al. |
| 2019/0033372 A1 | 1/2019 | Gohel et al. |

OTHER PUBLICATIONS

Written Opinion for PCT/US2018/025630, 9 pages (dated Jul. 6, 2018).
File History of U.S. Appl. No. 15/583,608, 73 pages (Retrieved Aug. 24, 2017).
File History of U.S. Appl. No. 15/583,630, 79 pages (Retrieved Aug. 24, 2017).
File History of U.S. Appl. No. 15/583,664, 84 pages (Retrieved Aug. 24, 2017).
File History of U.S. Appl. No. 15/583,686, 77 pages (Retrieved Aug. 24, 2017).

* cited by examiner

OPTICAL PIN ELECTRONICS

TECHNICAL FIELD

This specification relates generally to pin electronics that may be used to test informational and parametric content of a signal, such as an optical signal.

BACKGROUND

A signal includes informational content and characteristics other than informational content. For example, an optical signal may have an optical power level, which is a measure of the energy delivered by the optical signal per unit of time. In another example, an electrical signal may have a signal-to-noise ratio, which reflects the relative amounts of signal and noise in a transmission. These signal characteristics that do not represent the informational content of the signal are referred to as parametric information, and may be represented by data, called parametric data.

SUMMARY

Example pin electronics comprises driver circuitry to output a first optical signal to a unit under test (UUT). The first optical signal is based on a first signal representing first informational content and one or more second signals representing first parametric information. The first parametric information comprises one or more signal characteristics other than the first informational content. The example pin electronics also includes receiver circuitry to receive a second optical signal from the UUT. The second optical signal is related to a third signal representing second informational content and one or more fourth signals representing second parametric information. The second parametric information comprises one or more signal characteristics other than the second informational content. Comparison circuitry is configured to obtain parametric data representing at least one of the first parametric information or the second parametric information, and to compare, based on the parametric data, the at least one of the first parametric information or the second parametric information to one or more thresholds. Control circuitry is programmatically controllable to adjust at least some of the first parametric information prior to output of the first optical signal, and to adjust one or more of the thresholds. The example pin electronics may include one or more of the following features, either alone or in combination.

The one or more thresholds may be independent of the first optical signal or the second optical signal. The driver circuitry may comprise: a vertical-cavity surface-emitting laser (VCSEL) or any other appropriate device, such as one or more lasers or light-emitting diode(s) (LEDs), to generate information content for the first optical signal; or a transmit optical sub-assembly (TOSA) to generate the first optical signal, and to output the first optical signal to the UUT. The receiver circuitry may comprise a receive optical sub-assembly (ROSA) to receive the second optical signal, and to generate an signal representing the second optical signal.

The driver circuitry may comprise measurement circuitry configured to obtain the parametric data for the first optical signal and to provide the parametric data to the comparison circuitry. The receiver circuitry may comprise measurement circuitry configured to obtain the parametric data for the second optical signal and to provide the parametric data to the comparison circuitry.

The parametric data may represent one or more of the following information about the first optical signal or the second optical signal: optical power level (also referred to as an optical signal power or optical signal power level), signal-to-noise ratio, modulation amplitude, extinction ratio, wavelength, rise time, fall time, slew rate, or any other characteristic relating to a wave or the wave's shape.

The comparison circuitry may comprise logic implementing one or more comparators. Each of the one or comparators may be configured to receive a parameter represented by at least some of the parametric data, to compare the parameter to one of the thresholds, and to provide an output based on the comparison. The parametric data may be optical signal power. The comparison circuitry may comprise logic implementing multiple comparators. Each of the multiple comparators may be for comparing the optical signal power to a different threshold.

Example automatic test equipment (ATE) may comprise pin electronics and one or more processing devices configured to communicate with the pin electronics. Example pin electronics that may be usable with the example ATE comprises driver circuitry to output a first optical signal to a unit under test (UUT). The first optical signal is based on a first signal representing first informational content and one or more second signals representing first parametric information. The first parametric information comprises one or more signal characteristics other than the first informational content. The example pin electronics also includes receiver circuitry to receive a second optical signal from the UUT. The second optical signal is related to a third signal representing second informational content and one or more fourth signals representing second parametric information. The second parametric information comprises one or more signal characteristics other than the second informational content. Comparison circuitry is configured to obtain parametric data representing at least one of the first parametric information or the second parametric information, and to compare, based on the parametric data, the at least one of the first parametric information or the second parametric information to one or more thresholds. Control circuitry is programmatically controllable to adjust at least some of the first parametric information prior to output of the first optical signal, and to adjust one or more of the thresholds.

An example system may comprise input circuitry comprising pin electronics; a first switch that is configurable to provide at least one of data representing the first informational content or data representing the second informational content to one or more first channels of the system; and a second switch that is configurable to route at least one of data representing the first parametric information or data representing the second parametric information to one or more second channels of the system. Example pin electronics that is usable with the example system comprises driver circuitry to output a first optical signal to a unit under test (UUT). The first optical signal is based on a first signal representing the first informational content and one or more second signals representing the first parametric information. The first parametric information comprises one or more signal characteristics other than the first informational content. The example pin electronics also includes receiver circuitry to receive a second optical signal from the UUT. The second optical signal is related to a third signal representing the second informational content and one or more fourth signals representing the second parametric information. The second parametric information comprises one or more signal characteristics other than the second informational content. Comparison circuitry is configured to obtain parametric data representing at least one of the first parametric information or the second parametric information, and to compare, based on the parametric data, the at least one of the first parametric information or the second parametric information to one or more thresholds. Control circuitry is programmatically controllable to adjust at least some of the first parametric information prior to output of the first optical signal, and to adjust one or more of the thresholds.

An example method includes operations comprising: providing a first optical signal for output to a unit under test (UUT), with the first optical signal being based on a first signal representing first informational content and one or more second signals representing first parametric information, and with the first parametric information comprising one or more signal characteristics other than the first informational content; and receiving a second optical signal from the UUT, with the second optical signal being related to a third signal representing second informational content and one or more fourth signals representing second parametric information, and with the second parametric information comprising one or more signal characteristics other than the second informational content. The example method may also comprise obtaining parametric data representing at least one of the first parametric information or the second parametric information; comparing, based on the parametric data, the at least one of the first parametric information or the second parametric information to one or more thresholds; and adjusting at least some of the first parametric information prior to output of the first optical signal. This example method may also include one or more of the foregoing features associated with the example systems or the example ATE.

An example system comprises means for providing a first optical signal for output to a unit under test (UUT). The first optical signal may be based on a first signal representing first informational content and one or more second signals representing first parametric information. The first parametric information may comprise one or more signal characteristics other than the first informational content. The example system comprises means for receiving a second optical signal from the UUT. The second optical signal may be related to a third signal representing second informational content and one or more fourth signal representing second parametric information. The second parametric information may comprise one or more signal characteristics other than the second informational content. The example system may also comprise means for obtaining parametric data representing at least one of the first parametric information or the second parametric information; means for comparing, based on the parametric data, the at least one of the first parametric information or the second parametric information to one or more thresholds; and means for adjusting at least some of the first parametric information prior to output of the first optical signal. This example system may also include one or more of the foregoing features associated with the example systems or the example ATE.

Example pin electronics may comprise driver circuitry to output a first optical signal to a unit under test (UUT). The first optical signal may be based on a first signal representing first informational content and one or more second signals representing first parametric information. The first parametric information may comprise one or more signal characteristics other than the first informational content. The example pin electronics may comprise receiver circuitry to receive a second optical signal from the UUT. The second optical signal may be related to a third signal representing second informational content and one or more fourth signals representing second parametric information. The second parametric information may comprise one or more signal characteristics other than the second informational content. The example pin electronics may comprise comparison circuitry to compare the first parametric information to a first threshold and the second parametric information to a second threshold; and control circuitry that is programmatically controllable to adjust the first and second thresholds independently.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Figure 1:
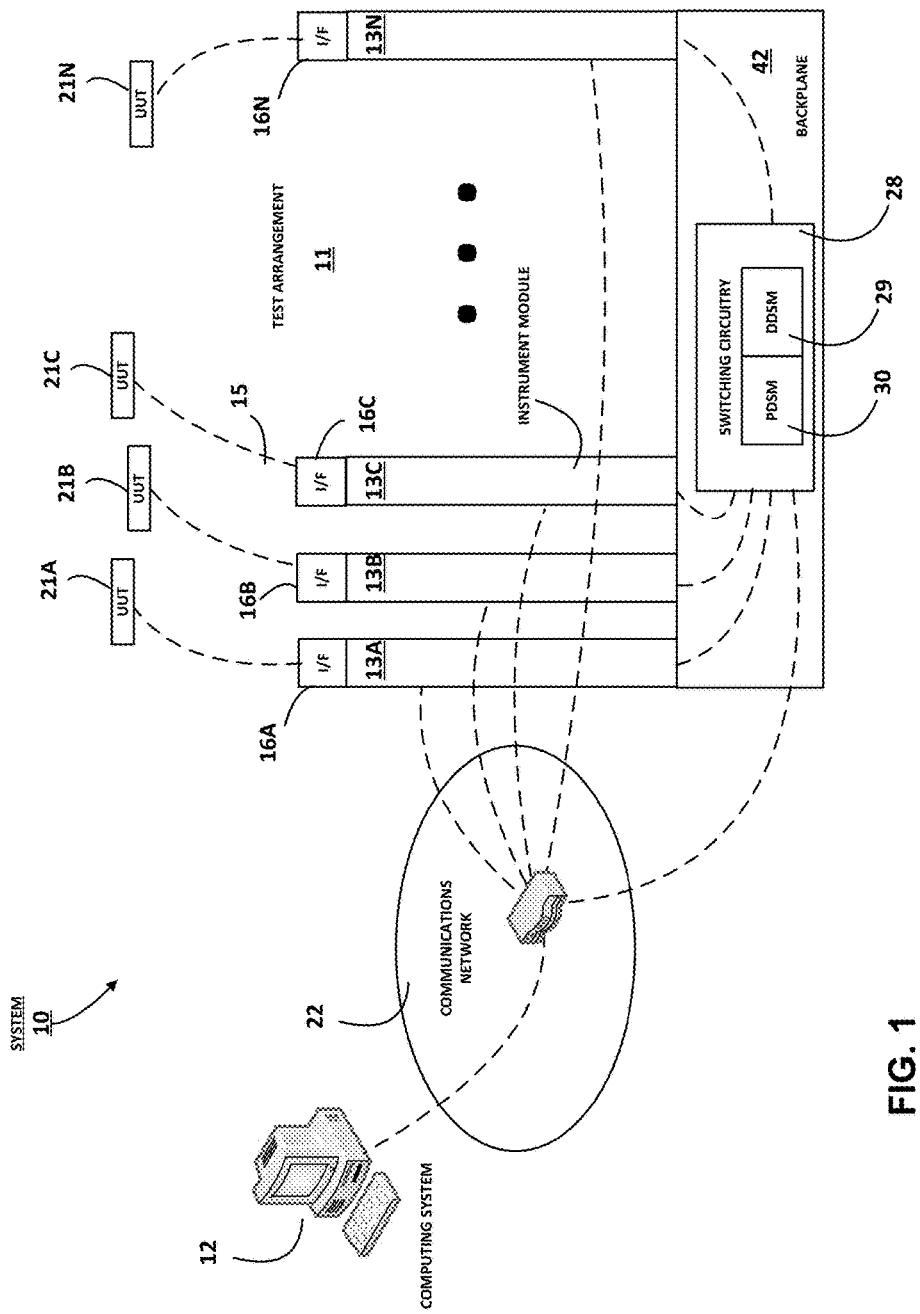
FIG. 1 is a block diagram of components of an example system that incorporates an implementation of the optical pin electronics described herein.

Described herein are example systems that include multiple instrument modules. Each of the instrument modules is configured to communicate with one or more devices being tested by the system, and also to communicate with other instrument modules that are part of the system. A device being tested is referred to herein as a device under test (DUT) or a unit under test (UUT). Each instrument module is part of a communication (e.g., test) channel (or simply, "channel"), over which communications occur. The instrument modules communicate with each other over one or more transmission media on a backplane or other appropriate structure to which the instrument modules interface. For example, the instrument modules may communicate data via one or more serial buses on the backplane or via an Ethernet-based network.

The communication data may include data that represents both informational content and data that represents one or more signal characteristics other than informational content. Data that represents the informational content is referred to herein as informational content data. Data that represents one or more signal characteristics other than informational content is referred to herein as parametric data. For example, in some implementations, an instrument module may receive an input signal. The input signal may be optical. The optical signal may represent, for example, test data from a UUT or commands from a host computing system to control testing. The optical signal may be received over one or more optical fibers interfaced to, or otherwise in communication with, the system. The optical signal represents information, as indicated, but also has other characteristics. For example, the optical signal may have an optical power level, a signal-to-noise ratio, a modulation amplitude, an extinction ratio, and a wavelength. The instrument module receives the optical signal and converts the optical signal into an electrical (e.g., digital) signal comprising data representing the informational content of the optical signal (e.g., the test data, commands, etc.). The instrument module also captures the other characteristics—the parametric information—associated with the optical signal, and generates parametric data representing this parametric information. Both the informational content data and the parametric data may constitute the communication data referred to above, and may be transmitted among the instrument modules and associated communication channels.

The input signal may also be, or include, an electrical signal. The electrical signal may be a digital signal or an analog signal, for example. Electrical signals also have associated parametric information, such as signal-to-noise ratio, amplitude values, and so forth. Thus, an instrument module may receive an electrical signal—which may be analog or digital—generate informational content data representing the received electrical signal, and generate parametric data representing the parametric information associated with the electrical signal. The processing described herein for the resulting informational content data and parametric data is substantially the same regardless of whether the original input signal is optical or electrical. For this reason, the following addresses receipt of an optical signal only, with the understanding that the processing described applies equally in cases where the original input signal is electrical. Also, individual channels may contain more than one informational stream and, although the processing described herein relates to individual streams per channel, the processing described herein likewise applies to multiple streams per channel.

Instrument modules in the system may be configured to implement pin electronics functionality, referred to herein as optical pin electronics. In some implementations, the optical pin electronics are configurable to pass an optical signal or an electrical (digital) signal to and from the UUT while allowing programmatic control of parametric values of the signals to test the UUT. Taking an optical signal as an example (similar concepts apply to an electrical signal), there are many parameters associated with transmitting an optical signal. These parameters include, but are not limited to, an optical power level, a signal-to-noise ratio, an optical modulation amplitude, an extinction ratio, a wavelength, a rise time, a fall time, a slew rate, or any other characteristic relating to a wave or the wave's shape. The example optical pin electronics described herein supports programmable parameters that are used to control, and to regulate, parameters of an output optical signal, such as optical signal power, as well as to measure and to test parameters of an input optical signal, such as optical signal power.

In some implementations, an example instrument module may include driver circuitry to output optical signals to a UUT over one or more optical fibers, and receiver circuitry to receive optical signals from the UUT over one or more optical fibers. In some implementations, the driver circuitry and the receiver circuitry may be coupled to, and configured to communicate over, the same optical fiber or over the same set of optical fibers. Each output optical signal may be based on, e.g., constructed from, an electrical signal comprising informational content data and one or more other electrical signals comprising parametric data, e.g., parameters such as optical power, wavelength, etc. Control circuitry may be configurable to adjust at least some of the parametric information in order to adjust parameters of the output optical signal, e.g., to change its optical power and/or other appropriate characteristic(s). Each received optical signal may be related to, and convertible into, an electrical signal representing informational content and one or more other electrical signals representing parametric information. The control circuitry also may be configurable to adjust or define at least some test limits of the received optical signal. In some implementations, the electrical signals described herein are high-speed digital data. In an example, high-speed data may include data that is transmitted on the order of gigabits-per-second (Gb/s) (e.g., from 1 Gb/s to 12 Gb/s or higher); however, the optical pin electronics described herein is not limited to use with such data transmission speeds.

Comparison circuitry (e.g., comparators or other appropriate logic) obtains parametric data representing parametric information defining the output optical signal and/or the received optical signal, and compares the parametric information to one or more programmable thresholds. The one or more programmable thresholds may be set independently based on one or more programmatic inputs. Comparison to the threshold(s) may be a way of determining whether a signal provided by, or to, the UUT has acceptable parametric characteristics, such as an acceptable power level.

Taking the case of optical power as an example, the optical pin electronics may provide sourcing and measuring capabilities on each channel to control optical power level. In some implementations, the average optical output power is regulated to a desired static or dynamic level. A static level includes a value specified by a user. A dynamic level includes a power level that is related to a measured power level of an external or internal reference. For example, the optical power on one channel may be controlled based on parametric data representing the optical power on another channel. For example, any appropriate parameter on one channel may be controlled based on parametric data for another channel. In general, since the measured parameters on one channel can be used to produce a signal on another channel, the system described herein can be used simulate signal attenuation and/or signal amplification in some implementations. The example optical pin electronics also supports programmatic control of the optical modulation amplitude of the optical output. Controlling the optical modulation amplitude effectively allows control of the extinction ratio. Circuitry to implement the optical pin electronics functions is described in more detail below.

FIG. 1 shows components of example system 10 that incorporates an example switch matrix system. Notably, however, the switch matrix system described herein is not limited to use in the context of testing or to use with the example system described herein, but rather may be used in any appropriate technical context, including outside of a testing environment. In FIG. 1, the dashed lines represent, conceptually, potential signal paths between components of the system. In this regard, in some implementations, the host computing system does not communicate directly with the instrument modules. Rather, there is a local bus that is controllable by a field programmable gate array (FPGA) on the backplane that handles communication between the instrument modules and the host computing system. In some implementations, the FPGA that handles the communications is the same FPGA that implements the PDSM, which is described in more detail below.

System 10 includes a test arrangement 11 and a host computing system 12. Test arrangement 11 may include interfaces (I/F) to one or more UUTs 21A to 21N on which tests are performed. Host computing system 12 communicates with components of the test arrangement to control testing. For example, host computing system 12 may download test program sets (TPSs) to instrument modules 13A to 13N in the test arrangement, which then run the test program sets to test UUTs in communication with the instrument modules. Host computing system 12 may also send, to instrument modules in the test arrangement, instructions, test data, and/or other information that is usable by the corresponding instrument module to perform appropriate tests on a UUT interfaced thereto. In some implementations, this information may be sent via a computer or other type of network 22. In some implementations, the foregoing information may be sent via an optical network comprised of fiber optic lines that transmit optical signals between the instrument modules and the computer. Conversions between optical and electrical signals may be performed by the host computing system and by the respective instrument modules, as described herein. In some implementations, the foregoing information may be sent via a computer network, such as a local area network (LAN) or a wide area network (WAN).

Host computing system 12 may configure switching circuitry 28—which may include a digital data switch matrix (DDSM) 29 and a parametric data switch matrix (PDSM) 30 in this example—based on user-provided, or other, programmatic inputs. The DDSM is configured to provide, or distribute, to various instrument modules/communication channels, data that represents the informational content of an original signal, which is referred to herein as informational content data. The PDSM is configured to provide, or distribute, to various instrument modules/communication channels, parametric data representing one or more signal characteristics other than informational content. The programming may specify switch configurations within the DDSM and the PDSM, or other appropriate operations or configurations, including which ports should receive digital or parametric data. The DDSM and PDSM may be programmed and reprogrammed in real-time, as appropriate.

In some implementations, the DDSM is implemented using a cross-point switch matrix; and, in some implementations, the PDSM is implemented using an FPGA. In some implementations, the DDSM is implemented using a cross-point switch matrix that receives and forwards data without performing any processing on the data; and, in some implementations, the PDSM is implemented using an FPGA that receives and forwards data and is also capable of performing processing on the data. However, hardware other than that described herein may be used to implement the DDSM and the PDSM. Thus, the DDSM and/or the PDSM may be capable of processing data.

In the example of FIG. 1, system 10 includes instrument modules 13A to 13N, each of which may be configured, as appropriate, to perform one or more of the functions described herein. Although only four instrument modules are depicted, the system may include any appropriate number of instrument modules, including those residing outside of test arrangement 11. Each instrument module has a corresponding interface (I/F) 16A to 16N for outputting signals to, and receiving signals from, a corresponding UUT. In some implementations, each instrument module may be configured to output test signals to test a UUT based, e.g., on data provided by the host computing system, and to receive signals from the UUT, e.g., in response to the test signals. Different instrument modules may be configured to perform different tests and/or be configured to test different UUTs. The signals received may include response signals that are based on the test signals and/or signals that originate from the UUT that are not prompted by (e.g., are not in response to) test signals. In some implementations, there may be optical connections between the UUT and the instrument module interfaces, in which case the test data and response signals may be sent optically. In some implementations, there may be direct fiber optic lines/links between the UUTs and the interfaces, over which optical signals are transmissible. In some implementations, there may be an optical network between the UUTs and the interfaces, over which optical signals are transmissible. In some implementations, the UUT may only interface with instrument modules through the DDSM or PDSM.

Each instrument module may include input circuitry (e.g., an interface card) for receiving signals from one or more UUTs or other appropriate signal source(s). Each instrument module may include output circuitry for outputting signals to a communication channel defined by the instrument module. The input circuitry and output circuitry may reside in the interface of each instrument module. In some implementations that employ optical communications, each instance of the input circuitry includes an interface circuit configured to receive an optical signal, configured to convert the optical signal to an electrical (e.g., a digital) signal comprising informational content data, configured to obtain parametric information about the optical signal before, during, or after the conversion process, and configured to obtain parametric data based on the information (e.g., to generate digital data representing the parametric information). In an example, the parametric information may be measured by the interface circuit and converted to digital data by the interface circuit or other appropriate logic. In some implementations that employ optical communications, each instance of the output circuitry includes an interface circuit configured to receive an electrical (e.g., a digital) signal, configured to convert the electrical signal to an optical signal, configured to obtain parametric information about the optical signal before, during, or after the conversion process, and configured to obtain parametric data based on the information (e.g., to generate digital data representing the parametric information). In an example, the parametric information may be measured by the interface circuit and converted to digital data by the interface circuit or other appropriate logic. In some implementations, the interface circuit may be implemented using a device, such as a field-programmable gate array (FPGA), an application-specific integrated circuit (ASIC), or other appropriate hardware.

In some implementations, one or more instrument modules include one or more optical interfaces that are designed to support 850 nanometers (nm) multi-mode optical communication from 1 Gb/s to 12 Gb/s or higher. In some implementations, other types of optical interfaces may be used.

The instrument modules 13A to 13N may be interconnected through backplane 42 or any other appropriate electrical or mechanical mechanism. For example, instrument modules 13A to 13N may mechanically interface, e.g., plug into, backplane 42 of FIG. 1. Backplane 42 may include one or more transmission media over which communications pass among the various instrument modules. For example, the transmission media may be, or include, one or more serial buses such as a peripheral component interconnect express (PCIe) bus, Ethernet cable, or other appropriate media. In the case of a PCIe bus, the parametric data may be encapsulated in PCIe bus packet format and transmitted from instrument module logic (e.g., an FPGA) to the PDSM. In some implementations, different parametric data types may be stored in different packets. In some implementations, the PDSM decodes incoming PCIe bus packets and stores the decoded parametric data in data-type-specific random access memory (RAM), which may also reside on the backplane and which may be accessed by the instrument modules and the host computing system. Bus protocols other than PCIe and other types of encapsulation may be used.

Communications among the instrument modules pass through switching circuitry 28 which, as described herein, includes one or more programmable switching matrices in some implementations. Switching circuitry 28 is configurable to receive informational content data and parametric data, and to distribute the informational content data and parametric data among the instrument modules. As explained, informational content data received from an instrument module may be provided to one or more of the same communication channels, or to one or more different communication channels. Parametric data received from an instrument module may be provided to one or more of the same communication channels, or to one or more different communication channels. In some implementations, some of the informational content data may be sent to one set of channels, and some of the parametric data may be sent to another set of channels, with the first and second sets overlapping, at least in part. In some implementations, the informational content data and the parametric data may be sent to different numbers of channels or to the same number of channels. Basically, any routing that is appropriate may be implemented. In some implementations, instrument modules may receive data from the switching circuitry, manipulate that data, and send the data back to the switching circuitry via one or more other instrument modules. Example instrument module functionalities are described below.

A separate processing device (e.g., a hardware processing device), which may or may not reside on the backplane, may perform processing before, during, or after distribution implemented by the switches. In some implementations, processing may be directed by, or under control of, host computing system 12, which is described below. In some implementations, the processing may be performed in the instrument modules. In some implementations, network 22 communicates through transmission media and logic on the backplane 42 with instrument the modules.

In some implementations, host computing system 12 communicates with the instrument modules via the backplane over a network 22, which may be an appropriate Ethernet-based communication network, an appropriate optical network, a wireless network, or some combination thereof. Thus, in some implementations, network 22 may be, or include one or more optical networks, including fiber optic links between the host computing system and the instrument modules In some implementations, network 22 may be, or include, a LAN, wide area network (WAN), or a combination thereof. In some implementations, network 22 may be, or include, a combined optical and electrical network between the host computing system and instrument modules.

As noted, each instrument module may include a separate interface 16A to 16N, e.g., an optical interface, that connects, through one or more optical transmission media, directly to a UUT. In some implementations, including interface 16A shown in FIG. 2, each interface includes a transmit optical sub-assembly (TOSA) 30 and a receive optical sub-assembly (ROSA) 31. In some implementations, the interface includes a bi-directional optical sub-assembly (BOSA) (not shown), which implements both transmit and receive functions. In some implementations, the interface instead includes circuitry other than that described with respect to FIG. 2. Any appropriate interface that converts optical signals to electrical signals, and vice versa, may be used.

Figure 2:
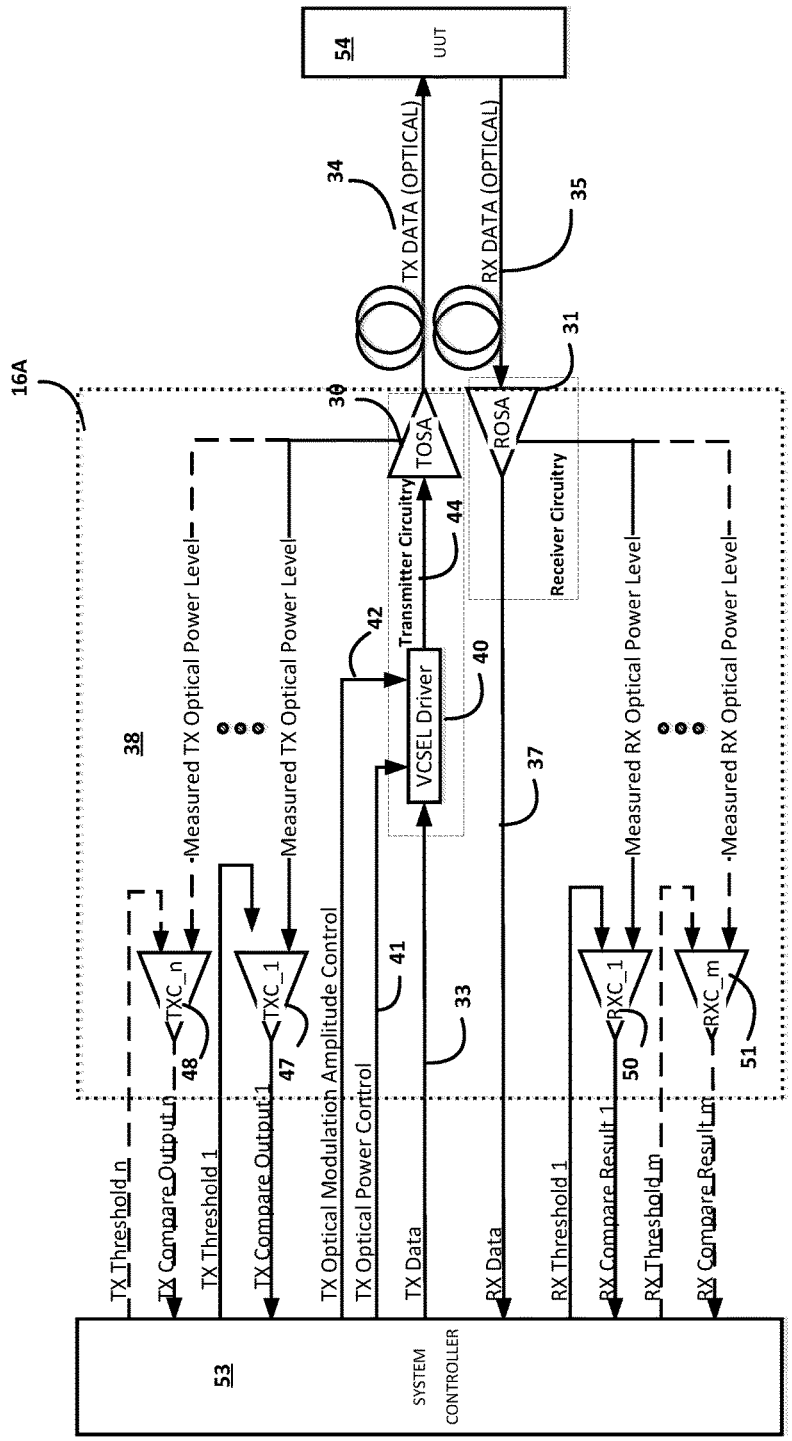
FIG. 2 is a block diagram of components of example optical pin electronics that may be incorporated into the optical interface of an instrument module in the example system.

An example TOSA includes a laser diode, an optical interface, a monitor photodiode, a metal and/or plastic housing, and an electrical interface. The TOSA is used to convert an electrical signal ("TX Data") 33 into an optical signal ("TX DATA OPTICAL") and to output the optical signal to an optical transmission medium (e.g., fiber) 34. In some implementations, the TOSA produces an optical signal and passes the optical signal to one or more optical fibers. An example ROSA includes a photodiode, an optical interface, a metal and/or plastic housing, and an electrical interface. The ROSA is used to receive an optical signal ("RX DATA OPTICAL") from an optical transmission medium (e.g., one or more optical fibers) 35 and to convert the received signal to an electrical signal ("RX Data") 37. An example BOSA includes components of a TOSA and components of a ROSA. The BOSA also includes a TOSA, a ROSA, and wavelength division multiplexer to enable bidirectional transmission and to support two wavelengths on each fiber. The TOSA and the ROSA also may have these features and capabilities. As shown in FIG. 2, in some implementations, media 34 and 35 may be connected to a device, such as UUT 54, which transmits signals (e.g., test response signals) to, and receives signals (e.g., test data) from, the instrument module.

As shown in FIG. 2, in some implementations, the optical interface is part of optical pin electronics 38 and includes a vertical-cavity surface-emitting laser (VCSEL) driver 40. VCSEL driver 40 drives the TOSA, which transmits an optical signal to the optical transmission medium 34. In some implementations, the TOSA includes, or is replaced by a device that includes a VCSEL, which is a semiconductor-based laser diode that emits an optical beam that is generated from electrical signals. In some implementations, the driver enables setting of the bias current and modulation current which directly affect the power levels of the optical output. In general, any appropriate device, such as one or more lasers or light-emitting diode(s) (LEDs), may be used to generate information content for the first optical signal.

In some implementations, the TOSA (or BOSA), the VCSEL driver, and the system controller 53 constitute components of control circuitry that are controllable to adjust, or define, parametric information that affects generation of the output optical signal. In some examples, the system controller may be part of a hardware processor (e.g., an FPGA) or may be under control of the host processing system. For example, the system controller may issue commands included within parametric data 41, 42, to adjust or define parametric information of the output optical signal. The TOSA may generate an optical signal having parameters defined by the parametric data 41, 42 and having informational content defined by the Tx data 33.

In some implementations, the ROSA (or BOSA) and the system controller constitute components of the control circuitry that are controllable to adjust, or define, parametric information that represents the input optical signal. For example, the system controller may issue commands included with parametric data to adjust or define parametric data for the input optical signal. The ROSA may generate one or more electrical signals representing parameters defined by that parametric data and having informational content defined by the input optical signal.

In some implementations, optical pin electronics 38 also includes comparison circuitry, e.g., multiple comparators, examples of which are 47 and 48. The comparators may be implemented in discrete components or digitally-implemented using programmable logic, such as an FPGA. The comparison circuitry is configured to obtain parametric data representing parametric information of either the received optical signal or the output optical signal, and to use that data to compare the parametric information to one or more predefined, programmable thresholds. For example, each comparator may be configured to compare received parametric information to a different threshold. In FIG. 2, the parameter is optical power ("Measured TX Optical Power Level" for the transmit channel, and "Measured RX Optical Power Level" for the receive channel). For the transmit channel, comparators 47, 48 (TXC_n), of which only two are shown but others may be present, compare the optical power measured or otherwise obtained from the output optical signal (TX DATA (OPTICAL)) to different thresholds ("TX Threshold 1" to "TX Threshold n"). Likewise, comparators 50, 51 (RXC_n), of which only two are shown but others may be present, compare the optical power measured or otherwise obtained from the received optical signal (RX DATA (OPTICAL)) to different thresholds ("RX Threshold 1" to "RX Threshold m"). Each comparator outputs its comparison result ("TX Compare Output 1" to "TX Compare Output n", and "RX Compare Result 1" to "RX Compare Result m").

In some implementations, there may be sets of comparators and thresholds for each different type of parametric information. For example, optical power is described with respect to FIG. 2. However, different comparators and corresponding thresholds may be used to measure different parameters including, but not limited to, signal-to-noise ratio, optical modulation amplitude, extinction ratio, ratio, wavelength, rise time, fall time, and/or slew rate. In some implementations, a UUT may be specified to operate between parameters A and B, such as within a particular signal amplitude. The pin electronics described herein allows for the parameters to be adjusted independently while measuring a response from the UUT and comparing those parameters to programmable thresholds (e.g., programmable thresholds that are, or are based on, parameters A and B). As a result, the system can be used to confirm that the UUT actually operates between A and B. In some implementations, the system may be controlled to perform margining. In an example, margining the amplitude of a signal includes making small changes in the output power levels or optical modulation amplitude of a signal to determine where comparison results change. In an example, margining a threshold includes making small changes in the comparator thresholds to see where comparison results change.

The foregoing comparison results may be interpreted as test results. For example, if the optical signal power of a signal is within a range bounded by two thresholds, as determined from the comparisons, the optical signal may be deemed to be acceptable and thereby pass a test. By contrast, if the optical signal power of a signal is outside a range bounded by two threshold, as determined from the comparisons, the optical signal may be deemed to be unacceptable (e.g., the optical power may be too low for a particular application) and thereby fail a test. In some implementations, the comparison results may be transmitted to system controller 53, which interprets those results, e.g., as pass or fail test results. System controller may also be configured to control, and to adjust, the thresholds that are used by the comparators. The threshold may be adjusted independently for each comparator, providing flexibility in the system. In some implementations, system controller 53 may be implemented in programmable hardware, such as an FPGA or an ASIC. In some implementations, system controller 53 may be, or include, a computing system.

In an example implementation, the optical pin electronics of FIG. 2 performs parametric testing while transmitting high-speed serial data. In some implementations, the comparison function performed by the comparison circuitry is performed by continually sampling each measured optical power using, e.g., a 24-bit analog-to-digital converter (ADC) (not shown) and digitally comparing the result to a corresponding programmable threshold that is also represented by 24 bits.

In the example of FIG. 2, the comparators in the comparison circuitry are implemented using an FPGA, and multiple comparator functions can be implemented using the same hardware. In the example of FIG. 2, there are 1 through n (n>1) TX comparisons and results, and there are 1 through m (m>1) RX comparisons and results, where m and n can be any number determined the by a testing application. The optical pin electronics, however, may be implemented in any appropriate circuitry, and is not limited to that described in FIG. 2 or elsewhere herein.

In some implementations, the average optical power of each received optical signal is constantly monitored and compared, using the comparison circuitry, to valid power level(s) (threshold(s)) programmed into the system by a user. Thus, the user can designate minimum and maximum acceptable power levels during operation and obtain pass/fail information from the system during the test. For example, as described with respect to FIG. 2, if the optical signal power of a signal is within a range bounded by two thresholds, the optical signal may be deemed to be acceptable and thereby pass a test. By contrast, if the optical signal power of a signal is outside a range bounded by two thresholds, the optical signal may be deemed to be unacceptable and thereby fail a test.

Controlling optical transmitting parameters, such as optical output power and extinction ratio, may support margin testing of the UUT. For example, a user may want to emulate an optical fiber having a 2 decibel (dB) loss. The user can program the output optical signal of an instrument module to always produce a signal having an output power level that is 2 dB less than a power level measured at its input. The system may also support adding gain, e.g., programing the output of an instrument module to always produce a signal having an output power level that is 2 dB greater than the power level measured at an input.

In some implementations, the system can adjust the information content of input and/or output signals. For example, the system can inject digital errors, such as bit errors, timing errors, and jitter into the output signals. In some implementations, the system can receive electrical signals, such as digital signals, instead of optical signals. The system can process those received electrical signals in the manner described with respect to FIG. 2. The system can also output electrical signals, such as digital signals, instead of optical signals. The system can process those output electrical signals in the manner described with respect to FIG. 2.

The pin electronics and switch matrix described herein may be implemented as, or be part of, automatic test equipment (ATE). ATE refers to an automated, usually computer-driven, system for testing devices. ATE typically includes a computer system, such as that shown in FIG. 1, and one or more instrument modules (e.g., as shown in FIG. 1) or a single device having corresponding functionality. In an example operation, in response to instructions in a test program set (TPS), some ATE automatically generates input signals to be applied to a UUT, and monitors output signals from the UUT. In some implementations, pin electronics (which may be of the type described with respect to FIG. 2) in the ATE compares one or more features of the received output signals with expected responses (e.g., threshold) to determine whether the UUT is defective or has passed a test. In an example, an instrument module outputs voltage and/or current to the UUT, and receives voltage and/or current from the UUT. For example, in some implementations, ATE may be capable of forcing voltage to a UUT and sourcing current to the UUT. In some implementations, the ATE is capable of providing test signals to a UUT, receiving response signals from the UUT, and forwarding those response signals for processing to determine whether the UUT meets testing qualifications. Signals are transmitted between the ATE and the UUT over the communication channels described herein. The test and response signals may be processed as described herein, e.g., to identify their informational and parametric content, to distribute data representing the informational and parametric content, and so forth.

Figure 3:
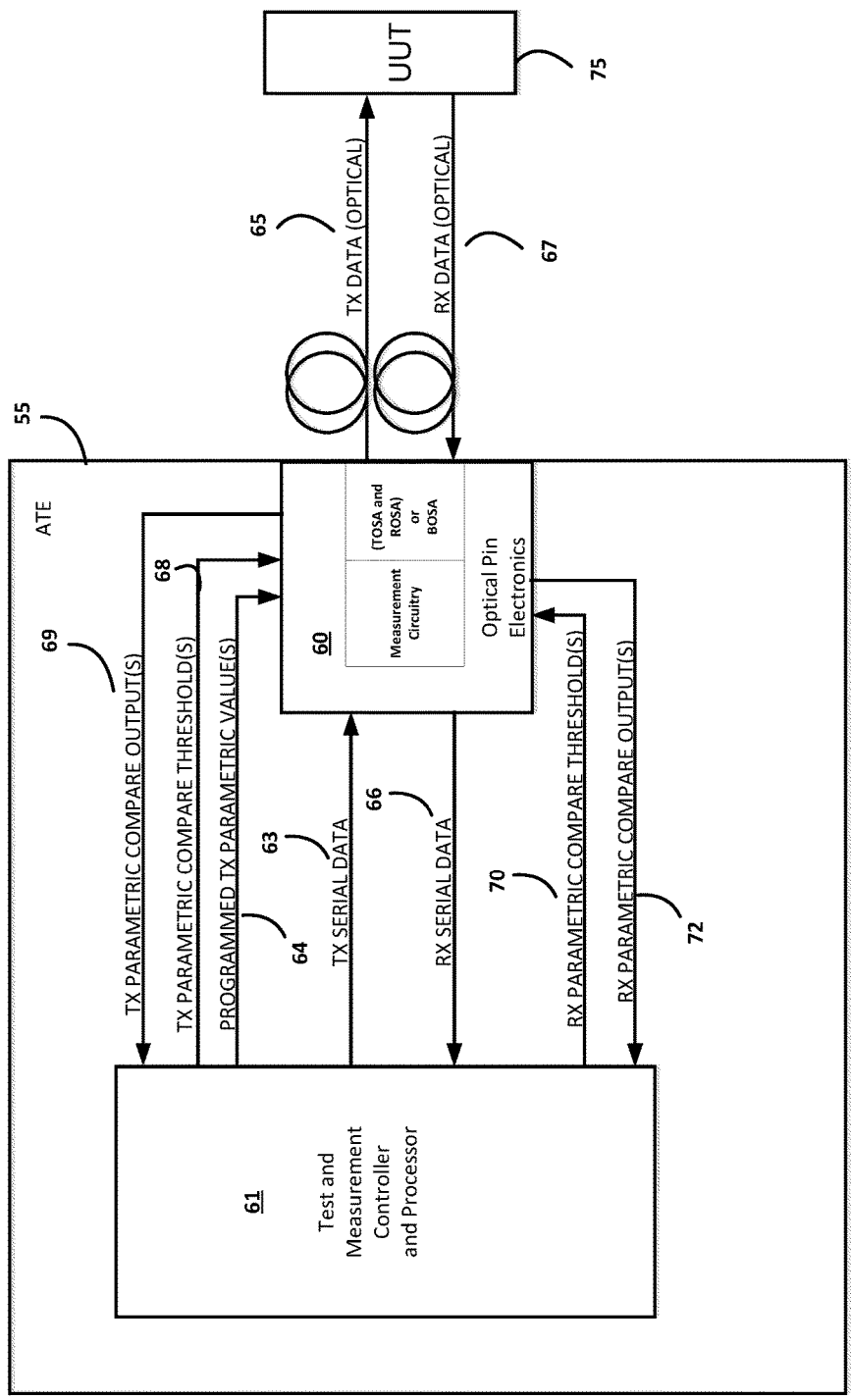
FIG. 3 is a block diagram of components of example automatic test equipment including components of example optical pin electronics.

FIG. 3 shows an example implementation of optical pin electronics 60 implemented in ATE. In this example optical pin electronics 60 may include components (e.g., comparators or comparator-configured programmable logic) similar to, or the same as, that described with respect to FIG. 2. Optical pin electronics 60 communicates with test and measurement control processor ("processor") 61. Processor 61 may be, or include, any appropriate processing device or combination of devices including, but not limited to, the examples described herein. In some implementations, processor 61 is programmed or otherwise configured, among other things, to output test signals to a UUT (not shown) and to receive signals from the UUT in order to interpret test results. Test signals and response signals pass through optical pin electronics 60 in the example implementation of FIG. 3.

In the example of FIG. 3, processor 61 is configured to output serial data 63 ("TX SERIAL DATA"), which is comprised of electrical signals in this example. Serial data 63 constitutes the informational content of the signals to be output to a UUT 75. Processor 61 is configured to provide programmed parametric value(s) 64 ("PROGRAMMED TX PARAMETRIC VALUE(S)"), which are comprised of electrical signals in this example. Programmed parametric value(s) 64 constitute the non-informational content of the signals to be output to the UUT 75. In this example, optical pin electronics 60 processes serial data 63 and programmed parametric value(s) 64 to generate optical data 65 ("TX DATA (OPTICAL)") for output to a UUT 75. In some implementations, the optical data 65 has the informational content of serial data 63 and the non-informational content of programmed parametric value(s) 64.

As described with respect to FIG. 2, parametric information from transmitted signals is measured by optical pin electronics 60 and, in this case, the comparison results 69 are provided to processor 61. To this end, processor 61 provides comparator threshold(s) 68 ("TX PARAMETRIC COMPARE THRESHOLD(S)")—e.g., for comparators such as 47 and 48 of FIG. 2. The comparator thresholds 68 are usable by optical pin electronics 60 for comparison against parametric information of output optical data 65 ("TX DATA (OPTICAL)"), as described with respect to FIG. 2. The comparison results are provided to processor 61. In some implementations, the parametric information itself is also provided to the processor. The comparison results may be used to indicate whether the output signal has appropriate parametrics.

As described with respect to FIG. 2, parametric information from received signals is measured by optical pin electronics 60 and, in this case, the comparison results 72 are provided to processor 61. To this end, processor 61 provides comparator threshold(s) 70 ("RX PARAMETRIC COMPARE THRESHOLD(S)")—e.g., for comparators such as 50 and 51 of FIG. 2. The comparator thresholds 70 are usable by optical pin electronics 60 for comparison against parametric information of received optical data 67 ("RX DATA (OPTICAL)"), as described with respect to FIG. 2. The comparison results are provided to processor 61. In some implementations, the parametric information itself is also provided to the processor. The comparison results may be used to indicate whether a UUT has passed or failed a particular test, for example. The optical pin electronics may include an amplifier and/or quantizer following a ROSA. The amplifier and/or quantizer may also be integrated into the system Controller or the ROSA itself.

In some implementations, test signals may be sent over multiple channels and test results may be based on response signals received from multiple channels. In some implementations, test signals may be sent over a single channel and test results may be based on response signals received from a single channel. In some implementations, test signals may be sent over a multiple channels and test results may be based on response signals received from a single channel. In some implementations, test signals may be sent over a single channel and test results may be based on response signals received from multiple channels. The circuitry described herein may be programmed, e.g., by a user at a host computing system or a test program set to send test signals over, and receive response signals from, a single channel or multiple channels as desired.

In the example of FIG. 3, optical fibers may be used to pass the transmit and receive optical data. In some implementations of the circuitry described herein, multiple optical transmission media (e.g., multiple optical fibers) may be used to provide at least informational content to a single electrical transmission medium (e.g., a wire). In some implementations of the circuitry described herein, multiple optical transmission media may be used to receive at least informational content from a single electrical transmission medium. In some implementations of the circuitry described herein, multiple electrical transmission media (e.g., multiple wires) may be used provide at least informational content to a single optical transmission medium (e.g., an optical fiber). In some implementations of the circuitry described herein, multiple electrical transmission media may be used to receive at least informational content from a single optical transmission medium. In some implementations of the circuitry described herein, the same circuitry may include one or more optical transmission media and one or more electrical transmission media to provide at least informational content to a single electrical transmission medium. In some implementations of the circuitry described herein, the same circuitry may include one or more optical transmission media and one or more electrical transmission media to receive at least informational content from a single electrical transmission medium. In some implementations of the circuitry described herein, the same circuitry may include one or more optical transmission media and one or more electrical transmission media to provide at least informational content to a single optical transmission medium. In some implementations of the circuitry described herein, the same circuitry may include one or more optical transmission media and one or more electrical transmission media to receive at least informational content from a single optical transmission medium.

In the examples described herein, including FIG. 3, processing of data is performed in the electrical domain. However, in some implementations, all or part of the processing maybe be performed in the optical domain using appropriate optical circuitry.

Testing performed using the example systems described herein may be implemented using hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The techniques described herein may be performed by systems or any other appropriate computing device. The techniques can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" or "optical connection" as used herein may imply a direct physical connection or a wired or wireless connection that includes or does not include intervening components but that nevertheless allows signals to flow between connected components. Any "connection" involving electrical circuitry or optical components mentioned herein that allows signals to flow between two points, unless stated otherwise, is not necessarily a direct physical connection regardless of whether the word "electrical" or "optical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. Pin electronics comprising:
   transmitter circuitry to output a first optical signal to a unit under test (UUT), the first optical signal being based on a first signal representing first informational content and one or more second signals representing first parametric information, the first parametric information comprising one or more signal characteristics other than the first informational content;
   receiver circuitry to receive a second optical signal from the UUT, the second optical signal being related to a third signal representing second informational content and one or more fourth signals representing second parametric information, the second parametric information comprising one or more signal characteristics other than the second informational content;
   comparison circuitry to obtain parametric data representing at least one of the first parametric information or the second parametric information, and to compare, based on the parametric data, the at least one of the first parametric information or the second parametric information to one or more thresholds; and
   a controller that is programmatically controllable to adjust at least some of the first parametric information prior to output of the first optical signal, and to adjust one or more of the thresholds.

2. The pin electronics of claim 1, wherein the one or more thresholds are independent of the first optical signal or the second optical signal.

3. The pin electronics of claim 1, wherein the transmitter circuitry comprises:
   a vertical-cavity surface-emitting laser (VCSEL) to generate content for the first optical signal; and either a transmit optical sub-assembly (TOSA) to generate the first optical signal, and to output the first optical signal to the UUT or a bi-directional optical sub-assembly (BOSA) to generate the first optical signal, and to output the first optical signal to the UUT.

4. The pin electronics of claim 1, wherein the receiver circuitry comprises a receive optical sub-assembly (ROSA) to receive the second optical signal, and to generate an signal representing the second optical signal; or wherein the receiver circuitry comprises a bi-directional optical sub-assembly (BOSA) to receive the second optical signal, and to generate an signal representing the second optical signal.

5. The pin electronics of claim 1, further comprising measurement circuitry configured to obtain the parametric data for the first optical signal and to provide the parametric data to the comparison circuitry.

6. The pin electronics of claim 1, further comprising measurement circuitry configured to obtain the parametric data for the second optical signal and to provide the parametric data to the comparison circuitry.

7. The pin electronics of claim 1, wherein the parametric data represents one or more of the following information about the first optical signal or the second optical signal: optical power level, signal-to-noise ratio, optical modulation amplitude, extinction ratio, wavelength, rise time, fall time, or slew rate.

8. The pin electronics of claim 1, wherein the comparison circuitry comprises logic implementing one or more comparators, each of the one or comparators being configured to receive a parameter represented by at least some of the parametric data, to compare the parameter to one of the thresholds, and to provide an output based on the comparison.

9. The pin electronics of claim 8, wherein the parametric data represents optical signal power; and
wherein the comparison circuitry comprises logic implementing multiple comparators, each of the multiple comparators for comparing the optical signal power to a different threshold.

10. Automatic test equipment comprising:
the pin electronics of claim 1; and
one or more processing devices configured to communicate with the pin electronics.

11. A system comprising:
input circuitry comprising the pin electronics of claim 1;
a first switch that is configurable to provide at least one of data representing the first informational content or data representing the second informational content to one or more first channels of the system; and
a second switch that is configurable to route at least one of data representing the first parametric information or data representing the second parametric information to one or more second channels of the system.

12. A method comprising:
providing a first optical signal for output to a unit under test (UUT), the first optical signal being based on a first signal representing first informational content and one or more second signals representing first parametric information, the first parametric information comprising one or more signal characteristics other than the first informational content;
receiving a second optical signal from the UUT, the second optical signal being related to a third signal representing second informational content and one or more fourth signals representing second parametric information, the second parametric information comprising one or more signal characteristics other than the second informational content;
obtaining parametric data representing at least one of the first parametric information or the second parametric information;
comparing, based on the parametric data, the at least one of the first parametric information or the second parametric information to one or more thresholds; and
adjusting at least some of the first parametric information prior to output of the first optical signal.

13. The method of claim 12, further comprising adjusting one or more of the thresholds.

14. The method of claim 12, wherein the one or more thresholds are independent of the first optical signal or the second optical signal.

15. The method of claim 12, wherein receiving is performed by receiver circuitry comprising a receive optical sub-assembly (ROSA) receiving the second optical signal, and generating an signal representing the second optical signal; or
wherein receiving is performed by receiver circuitry comprising a bi-directional optical sub-assembly (BOSA) receiving the second optical signal, and generating an signal representing the second optical signal.

16. The method of claim 12, wherein outputting is performed by transmitter circuitry obtaining the parametric data for the first optical signal and providing the parametric data.

17. The method of claim 12, wherein receiving is performed by receiver circuitry obtaining the parametric data for the second optical signal and providing the parametric data to the comparison circuitry.

18. The method of claim 12, wherein the parametric data represents one or more of the following information about the first optical signal or the second optical signal: optical power level, signal-to-noise ratio, optical modulation amplitude, extinction ratio, wavelength, rise time, fall time, or slew rate.

19. The method of claim 12, wherein comparing is performed by comparison circuitry comprising logic implementing one or more comparators, each of the one or comparators receiving a parameter represented by at least some of the parametric data, comparing the parameter to one of the thresholds, and providing an output based on the comparison.

20. The method of claim 19, wherein the parametric data represents optical signal power; and
wherein the comparison circuitry comprises logic implementing multiple comparators, each of the multiple comparators comparing the optical signal power to a different threshold.

21. A system comprising:
means for providing a first optical signal for output to a unit under test (UUT), the first optical signal being based on a first signal representing first informational content and one or more second signals representing first parametric information, the first parametric information comprising one or more signal characteristics other than the first informational content;
means for receiving a second optical signal from the UUT, the second optical signal being related to a third signal representing second informational content and one or more fourth signal representing second parametric information, the second parametric information comprising one or more signal characteristics other than the second informational content;
means for obtaining parametric data representing at least one of the first parametric information or the second parametric information;
means for comparing, based on the parametric data, the at least one of the first parametric information or the second parametric information to one or more thresholds; and
means for adjusting at least some of the first parametric information prior to output of the first optical signal.

22. Pin electronics comprising:
transmitter circuitry to output a first optical signal to a unit under test (UUT), the first optical signal being based on a first signal representing first informational content and one or more second signals representing first parametric information, the first parametric information comprising one or more signal characteristics other than the first informational content;
receiver circuitry to receive a second optical signal from the UUT, the second optical signal being related to a third signal representing second informational content and one or more fourth signals representing second parametric information, the second parametric information comprising one or more signal characteristics other than the second informational content;
comparison circuitry to compare the first parametric information to a first threshold and the second parametric information to a second threshold; and
a controller that is programmatically controllable to adjust the first and second thresholds independently.

* * * * *